(12) United States Patent
Takeuchi et al.

(10) Patent No.: US 11,410,911 B2
(45) Date of Patent: Aug. 9, 2022

(54) SEMICONDUCTOR MODULE

(71) Applicant: Mitsubishi Electric Corporation, Tokyo (JP)

(72) Inventors: Kensuke Takeuchi, Tokyo (JP); Masayuki Funakoshi, Tokyo (JP); Takashi Nagao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/048,677

(22) PCT Filed: Aug. 2, 2018

(86) PCT No.: PCT/JP2018/028968
§ 371 (c)(1),
(2) Date: Oct. 19, 2020

(87) PCT Pub. No.: WO2020/026397
PCT Pub. Date: Feb. 6, 2020

(65) Prior Publication Data
US 2021/0151362 A1 May 20, 2021

(51) Int. Cl.
*H01L 23/48* (2006.01)
*H01L 23/31* (2006.01)
(Continued)

(52) U.S. Cl.
CPC .............. *H01L 23/48* (2013.01); *H01L 23/31* (2013.01); *H01L 24/40* (2013.01); *H01L 24/48* (2013.01);
(Continued)

(58) Field of Classification Search
CPC ......... H01L 23/48; H01L 23/31; H01L 24/40; H01L 24/48; H01L 25/07; H01L 25/18
See application file for complete search history.

(56) References Cited

U.S. PATENT DOCUMENTS

2011/0285226 A1* 11/2011 Fujita ................ H01L 23/49575
318/400.27
2011/0285336 A1 11/2011 Fujita et al.
(Continued)

FOREIGN PATENT DOCUMENTS

JP 2011-250491 A 12/2011
JP 5201171 B2 6/2013
(Continued)

OTHER PUBLICATIONS

Notice of Reasons for Refusal dated Nov. 16, 2021 from the Japanese Patent Office in Japanese Application No. 2020-533983.
(Continued)

*Primary Examiner* — Marc Anthony Armand
(74) *Attorney, Agent, or Firm* — Sughrue Mion, PLLC; Richard C. Turner

(57) ABSTRACT

A semiconductor module such that warping or distortion is prevented, and reliability can be increased, is obtained. The semiconductor module includes a base configuring a multiple of terminals or wires, a semiconductor switching element mounted on a mounting portion of the terminal, and a molded resin that seals the semiconductor switching element, wherein a wide portion having a width greater than that of the terminal or the wire is formed in one portion of the terminal or the wire in an outer peripheral side end portion of the molded resin, and the wide portion is embedded and fixed in an interior of the molded resin in a state extended toward the interior from the outer peripheral side end portion of the molded resin.

11 Claims, 4 Drawing Sheets

(51) Int. Cl.
  *H01L 23/00* (2006.01)
  *H01L 25/07* (2006.01)
  *H01L 25/18* (2006.01)

(52) U.S. Cl.
  CPC .............. *H01L 25/07* (2013.01); *H01L 25/18* (2013.01); *H01L 2224/40221* (2013.01); *H01L 2224/48247* (2013.01); *H01L 2924/181* (2013.01)

(56) References Cited

U.S. PATENT DOCUMENTS

| | | | |
|---|---|---|---|
| 2015/0214141 A1* | 7/2015 | Ye | H01L 24/49 257/401 |
| 2016/0293530 A1 | 10/2016 | Shinohara et al. | |
| 2017/0287819 A1 | 10/2017 | Fukase et al. | |

FOREIGN PATENT DOCUMENTS

| | | |
|---|---|---|
| JP | 2015-095486 A | 5/2015 |
| JP | 2017-188517 A | 10/2017 |

OTHER PUBLICATIONS

Extended European Search Report dated Jul. 15, 2021 from the European Patent Office in EP Application No. 18928157.9.
International Search Report for PCT/JP2018/028968 dated Oct. 16, 2018 [PCT/ISA/210].

\* cited by examiner

SEMICONDUCTOR MODULE

CROSS REFERENCE TO RELATED APPLICATIONS

This application is a National Stage of International Application No. PCT/JP2018/028968 filed Aug. 2, 2018.

TECHNICAL FIELD

The present application relates to a semiconductor module.

BACKGROUND ART

An existing semiconductor module is such that a multiple of terminals such as a positive (+) power supply terminal, a negative (−) power supply terminal, an output (load) terminal, and a control signal terminal are arrayed, a multiple of semiconductor switching elements or the like are disposed in an interior and connected to each terminal, and the whole is molded using a resin.

CITATION LIST

Patent Literature

Patent Literature 1: Japanese Patent No. 5,201,171

SUMMARY OF INVENTION

Technical Problem

For example, an internal structure of an existing semiconductor module disclosed in Patent Literature 1 is such that each terminal and a land are formed of copper plates that are of the same material, and the whole is resin molded. Also, a semiconductor switching element is mounted on the copper plate, and the terminal is extended. Also, the copper plate is connected to, for example, a frame that forms an external border in a process of forming the semiconductor module, and securing flatness of the copper plate is essential.

However, the semiconductor module disclosed in the previously described Patent Literature 1 is completed by a step of mounting the semiconductor switching element on the copper plate, a step of carrying out molding using a resin after performing a wire bonding process, and lastly, a step of cutting off an unneeded outer peripheral frame and unneeded portions connected thereto, meaning that stress is exerted on the copper plate in each step, because of which there is a problem in that securing flatness is difficult, and preventing warping or distortion of the copper plate is difficult.

The present application has been made to solve the above problem and an object of the present application is to provide a semiconductor module such that warping and distortion are prevented, and reliability can be increased, for a semiconductor module having a semiconductor switching element.

Solution to Problem

A semiconductor module disclosed in the present application includes a base configuring a multiple of terminals or wires, a semiconductor switching element mounted on a mounting portion of the terminal, and a molded resin that seals the semiconductor switching element, wherein a wide portion having a width greater than that of the terminal or the wire is formed in one portion of the terminal or the wire in an outer peripheral side end portion of the molded resin, and the wide portion is embedded and fixed in an interior of the molded resin in a state extended toward the interior from the outer peripheral side end portion of the molded resin.

Advantageous Effects of Invention

The semiconductor module disclosed in the present application implements a semiconductor module such that warping and distortion are prevented, and reliability can be increased, because a wide portion having a width greater than that of a terminal or a wire is formed in one portion of the terminal or the wire in an outer peripheral side end portion of a molded resin, and the wide portion is embedded and fixed in an interior of the molded resin in a state extended toward the interior from the outer peripheral side end portion of the molded resin.

DESCRIPTION OF EMBODIMENTS

Figure 1:
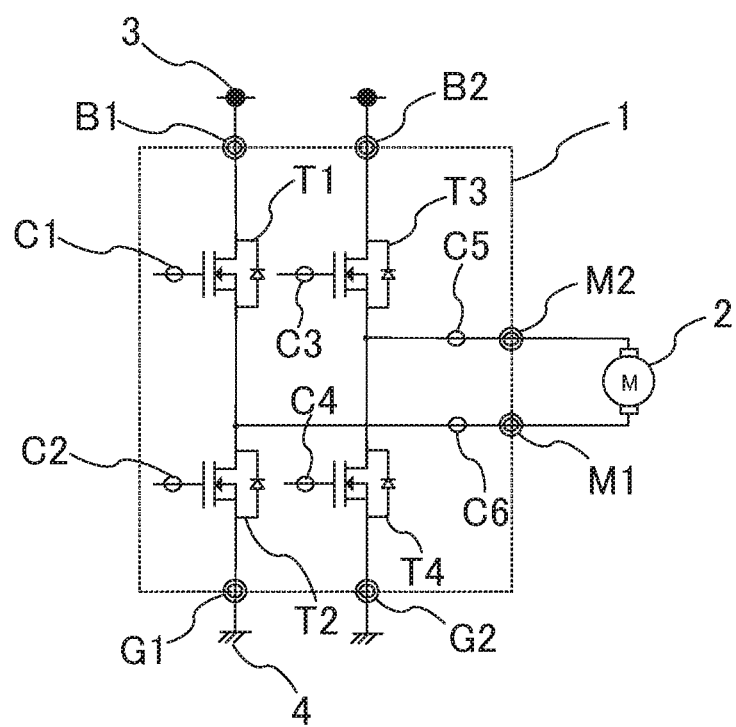
FIG. 1 is a circuit diagram showing a semiconductor module according to a first embodiment.

Hereafter, a semiconductor module according to a first embodiment will be described, based on the drawings.

In the drawings, identical reference signs indicate identical or corresponding portions.

First Embodiment

FIG. 1 is a circuit diagram showing a semiconductor module according to the first embodiment. A semiconductor module 1 incorporates at least a multiple of semiconductor switching elements T1 to T4. FIG. 1 shows an H-bridge circuit that drives a motor 2, and the semiconductor module 1 includes the motor 2, a positive (+) power supply 3, and a ground 4. In FIG. 1, circles indicate small signal terminals C1, C2, C3, C4, C5, and C6, and double circles indicate large current terminals B1, B2, G1, G2, M1, and M2. The semiconductor switching elements T1 to T4 are, for example, field effect transistors (FETs). As shown in FIG. 1, the semiconductor module 1 is such that a bridge circuit is configured of four FETs, and the motor 2 is connected to the small signal terminal C5, the small signal terminal C6, the large current terminal M1, and the large current terminal M2, which are upper and lower arm intermediate connection positions.

Also, the small signal terminals C1, C2, C3, and C4 are FET gate drive control signal terminals, and the small signal terminals C5 and C6 are terminals that monitor voltage of the motor 2. The large current terminal B1 and the large current terminal B2 are connected to the positive (+) power supply 3, and the large current terminal G1 and the large current terminal G2 are connected to the ground 4. Terminals that output to the motor 2 are the large current terminal M1 and the large current terminal M2.

Figure 2:
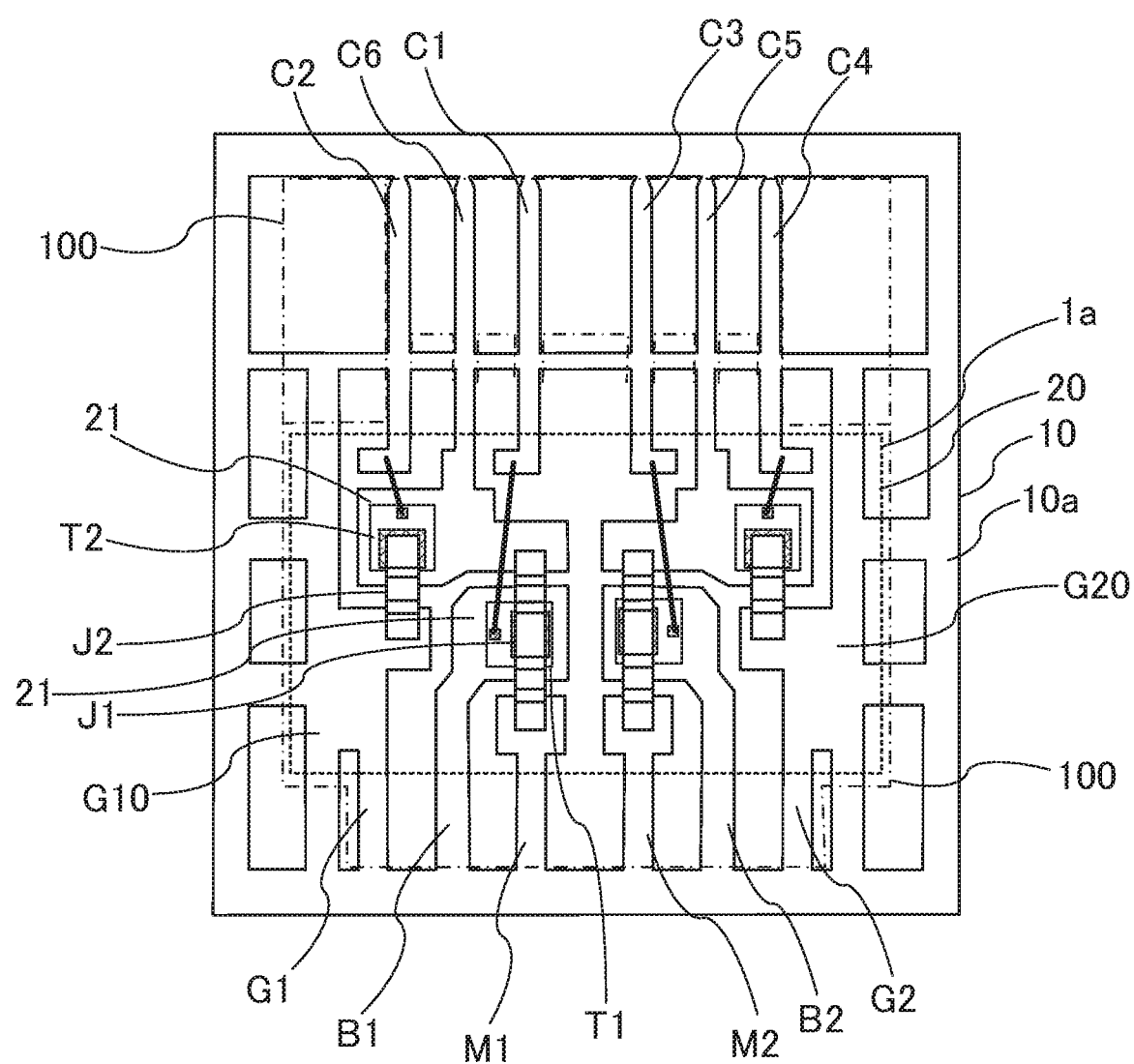
FIG. 2 is a plan view showing an internal configuration of the semiconductor module according to the first embodiment.

FIG. 2 is a plan view showing an internal configuration of the semiconductor module according to the first embodiment, wherein the circuit configuration shown in FIG. 1 is formed as a semiconductor module 1a. Also, FIG. 2 shows an uncompleted state of the semiconductor module 1a, wherein an external form of a molded resin 20 is indicated by a broken line, and a state before molding using a resin is carried out is shown. A frame 10 forms a plate-form base 10a of, for example, copper or a copper alloy, and the semiconductor switching elements T1 to T4 are mounted on the base 10a.

Specifically, the semiconductor switching element T1 is mounted on a mounting portion 21 formed integrated with the large current terminal B1. Also, the semiconductor switching element T2 is mounted on the mounting portion 21 formed integrated with the small signal terminal C6. According to the semiconductor module 1a of the first embodiment, a step of mounting the semiconductor switching elements T1 to T4 and a step of connecting the semiconductor switching elements T1 to T4 to respective wires are carried out in a state where the frame 10 remains. Also, the large current terminals G1, B1, M1, M2, B2, and G2 are arrayed on a lower side in the drawing, and the small signal terminals C2, C6, C1, C3, C5, and C4 are arrayed in order on an upper side in the drawing, on an inner side of the frame 10, which is an external border. The large current terminals G1, B1, M1, M2, B2, and G2 conduct a maximum of in the region of 100A. Also, the small signal terminals conduct several milliamps or less.

As shown in FIG. 1, the H-bridge circuit is such that FETs are connected in series in upper and lower arms, and are configured of pairs, because of which the dispositions in FIG. 2 are also dispositions that are the same left and right, that is, there is a mirror disposition. Because of this, only one of the dispositions and the connections will be described.

As shown in FIG. 2, the copper plate base 10a extends into an interior of the semiconductor module 1a from the large current terminal B1, and the FET that is the semiconductor switching element T1 is mounted on the mounting portion 21. The small signal terminal C1 is connected by wire bonding to a gate (not shown) of the FET that is the semiconductor switching element T1. The copper plate base 10a is directly connected to a drain (not shown) of the FET that is the semiconductor switching element T1, while a source (not shown) is electrically wired using a jumper wire J1. In the same way as the copper plate base 10a, the jumper wire J1 is formed in a copper plate form, and not only allows a large current to flow, but also has excellent heat conductivity.

One jumper wire J1 (on the lower side in the drawing) is connected to a separate base 10a, and this is connected to the large current terminal M1, which is a terminal for output to the motor 2. Another jumper wire J1 (on the upper side in the drawing) is connected to the base 10a of the FET that is the semiconductor switching element T2 of the lower arm. In the same way as the FET that is the semiconductor switching element T1, the FET that is the semiconductor switching element T2 is such that a gate is connected to the small signal terminal C2 by wire bonding, and a source is connected via a jumper wire J2 to the large current terminal G1, which is a ground wire.

As heretofore described, the semiconductor module 1a according to the first embodiment is such that after the semiconductor switching elements T1, T2, T3, and T4, the base 10a, the jumper wires J1 and J2, and the like are disposed and connected, molding using a resin is carried out in a position of the external form of the molded resin 20 indicated by a broken line, whereby sealing is carried out. Subsequently, the unneeded frame 10 is severed along a frame cutting line 100 indicated by a dash-dotted line in the drawing, whereby the semiconductor module 1a is completed.

Herein, the large current terminals G1 and G2, which are ground wires configured of the base 10a, are disposed on both left and right sides of the semiconductor module 1a in the drawing, and wide portions G10 and G20 are provided in one portion of the base 10a, that is, the large current terminals G1 and G2 that are ground wires. Specifically, the wide portions G10 and G20 are formed in outer peripheral side end portions of the molded resin 20. The wide portions G10 and G20 are formed to be wider than a wiring width compatible with an amount of current flowing through the large current terminals G1 and G2 that are ground wires. The large current terminals G1 and G2 conduct a maximum of in the region of, for example, 100A. That is, the wide portions G10 and G20 are wider than the large current terminals G1 and G2 that are ground wires, but as the wide portions G10 and G20 are of the same material as the base 10a, a thickness, for example, is the same as that of the large current terminals G1 and G2 that are ground wires, and only the width differs. The base 10a is a copper plate, and the base 10a is supported by the wide portions G10 and G20 until molded using a resin, because of which warping, distortion, or the like of the base 10a can be restricted.

In particular, there is a possibility of degrees of flatness of the bases 10a deviating due to a step of mounting the FETs that are the semiconductor switching elements T1 and T2, a wire bonding step, and a step of mounting the jumper wires J1 and J2. The semiconductor module 1a according to the first embodiment is of a structure where the frame 10, which is an external border, is supported by a multiple of arm portions of the bases 10a, because of which warping or distortion of the frame 10 can be restricted. Also, when severing the unneeded frame after molding, the wide portions G10 and G20, which are metal plates, are of a configuration embedded and fixed in an interior of the molded resin 20, in a state extending toward the interior from the outer peripheral side end portion of the molded resin 20 in both left and right ends of the molded resin 20, because of which the wide portions G10 and G20 form reinforcing members.

Also, one portion of the wide portions G10 and G20 is formed protruding from the external form of the molded resin 20, and provides a greater reinforcing effect. Furthermore, in terms of current, the wide portions G10 and G20 are such that electricity flows to the large current terminals G1 and G2 that are ground wires shown in FIG. 2. The wide portions G10 and G20 are wires that extend farther to the upper side in the drawing than a position in which the FET that is the semiconductor switching element T2 is disposed, and extend so as to follow one side of the molded resin 20, because of which the structure is strong against warping or distortion of the frame 10 and the molded resin 20.

According to the semiconductor module 1a according to the first embodiment, as heretofore described, the wide portions G10 and G20 are provided in either end portion of the base 10a of the semiconductor module 1a, that is, either outer peripheral side end portion of the molded resin 20, whereby warping and distortion of the molded resin 20 and the base 10a can be restricted from the start of a manufacturing process until after completion. Furthermore, reinforcement is accomplished by the base 10a in one portion of necessary wiring being widened, without adding a separate member for reinforcement, which is advantageous in terms of both cost and machinability.

Second Embodiment

Figure 3:
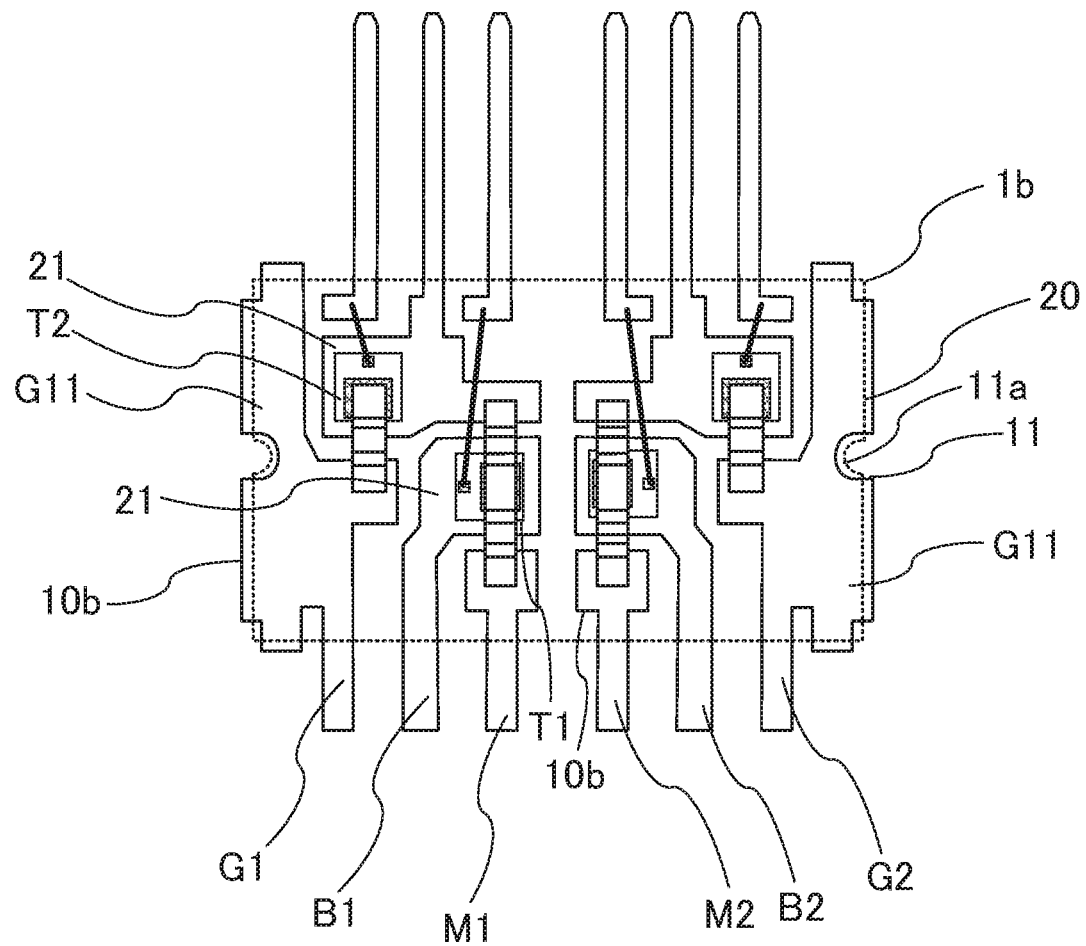
FIG. 3 is a plan view showing an internal configuration of a semiconductor module according to a second embodiment.

FIG. 3 is a plan view showing an internal configuration of a semiconductor module according to a second embodiment. As shown in FIG. 3, a circuit in a semiconductor module 1b is identical to that in FIG. 1, because of which the incorporated semiconductor switching elements T1 to T4 and the jumper wires J1 and J2 are also identical. Also, as the semiconductor module 1b is a completed article, a perspective view of an interior of the semiconductor module 1b molded using a resin is shown. A wide portion G11 is provided in the large current terminals G1 and G2, which are ground wires configured of a base 10b, on both left and right ends in the drawing. A semi-circular recessed portion 11 is provided in a central portion of a side end portion of the molded resin 20. Because of this, an equivalent recessed portion 11a is provided in the wide portion G11 too. As heat is generated by the semiconductor switching elements T1 to T4, the semiconductor module 1b is such that in order, for example, to improve heat dissipation, heat needs to be transferred from a back face (a back face opposite to the face on which the semiconductor switching element is mounted) of the base 10b using a heat dissipating heatsink or the like. In such a case, the semiconductor module 1b needs to be brought into close contact with the heatsink (not shown), and can be fixed using the recessed portions 11 and 11a. When tightening a fixing member, a screw for example, the wide portion G11 performs a reinforcing role. The recessed portions 11 and 11a may be hole portions.

Also, as shown in FIG. 3, the wide portion G11 is a wire integrated with the large current terminals G1 and G2 that are ground wires. Also, the wide portion G11 is provided in ground wires disposed neighboring the small signal terminals C2 and C4 and the large current terminals B1 and B2. The wide portion G11 is formed protruding in upward and downward directions from the molded resin 20. The protruding portion is a portion that is connected to the frame 10 (refer to FIG. 2), because of which the protruding portion further contributes to preventing warping or distortion of the frame 10 by being formed protruding from the molded resin 20. Also, the wide portion G11 can also be formed protruding in left and right directions from the molded resin 20. According to the semiconductor module 1b of the second embodiment, the wide portion G11 is formed protruding in left and right directions from the molded resin 20, which has an advantage of further contributing to improving heat dissipation.

According to the semiconductor module 1b according to the second embodiment, as heretofore described, the recessed portion 11a or a hole portion is provided in the wide portion G11, and there is an advantage in that fixing of the semiconductor module 1b can be carried out easily. Furthermore, the wide portion G11 is formed protruding beyond the outer periphery of the molded resin 20, whereby warping or distortion is prevented, and heat dissipation can be improved.

Third Embodiment

Figure 4:
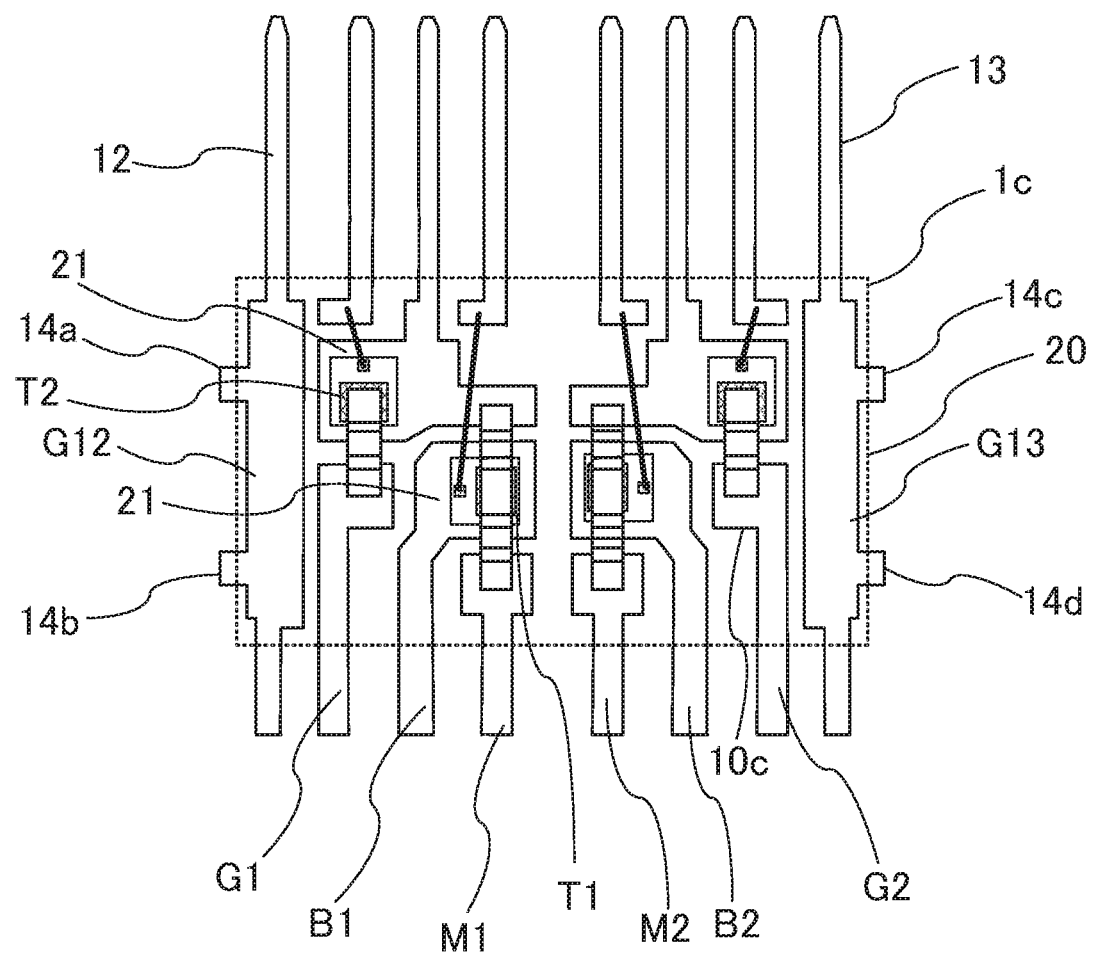
FIG. 4 is a plan view showing an internal configuration of a semiconductor module according to a third embodiment.

FIG. 4 is a plan view showing an internal configuration of a semiconductor module according to a third embodiment. As shown in FIG. 4, a circuit of a semiconductor module 1c of the third embodiment is an H-bridge circuit identical to that in FIG. 1, and the semiconductor switching elements T1 to T4 and the jumper wires J1 and J2 and the like are also identical. Wires 12 and 13 are installed each on left and right sides, which are outer peripheral side end portions of the molded resin 20 of the semiconductor module 1c. The wires 12 and 13 are copper plates, as is a base 10c, and wide portions G12 and G13 are formed integrated with the wires 12 and 13 respectively. The wires 12 and 13 form, for example, signal lines or power supply system lines, and perform a role of being for connecting to another part via the semiconductor module 1c. Because of this, terminals are formed extended in upward and downward directions in the drawing. According to the semiconductor module 1c of the third embodiment, the wires 12 and 13 are included in the outer peripheral side end portion of the molded resin 20 on either side, whereby the frame 10 and the molded resin 20 are supported until an unneeded portion is severed from the frame 10, which is an external border (refer to FIG. 2), because of which warping and distortion of the frame 10 and the molded resin 20 are prevented until a product is completed as the semiconductor module 1c. Because of this, according to the semiconductor module 1c according to the third embodiment, protruding portions 14a, 14b, 14c, and 14d are disposed for connection to the frame 10.

In addition to the semiconductor module 1c, parts such as a CPU and an interface unit are included in a whole device in which this kind of semiconductor module 1c is used, and the wires 12 and 13 can be used for connecting these parts to a power supply system or a signal line via the semiconductor module 1c. That is, the wires 12 and 13 of FIG. 4 are such that the terminals extend in upward and downward directions in the drawing, in the same way as another bridge circuit. When considering connection with another electronic part disposed in a periphery of the semiconductor module 1c, electrical wiring other than a bridge circuit is needed, and particularly when a part is disposed in an upward or downward direction in the drawing from the semiconductor module 1c, one portion of external wiring can be eliminated by utilizing the wires 12 and 13. Although the wide portions G12 and G13 are disposed as a left and right pair, a case where there is only one thereof may be adopted.

Furthermore, the wide portions G12 and G13 can also be disposed between bridge circuits. In the third embodiment, it is sufficient that the base 10c has wide portions G12 and G13 disposed to a length equivalent to an interior of the semiconductor module 1c. Also, when the base 10c having the wide portions G12 and G13 is a power supply system line, terminals arrayed neighboring the small signal terminals (C1 to C6) are desirably terminals that are wider than the small signal terminals (C1 to C6). Conversely, when the base 10c is used as a signal line, terminals arrayed neighboring the large current terminals may be terminals that are thinner than the large current terminals. Also, a structure may be such that the base 10c diverges from one portion of wiring in the interior of the semiconductor module 1c, and has a terminal at one end thereof. Whatever type is adopted, the semiconductor module 1c can be applied to a large variety of lines, provided that the interior of the semiconductor module 1c is wider than the width of the terminals.

According to the semiconductor module 1c according to the third embodiment, warping or distortion of the molded resin 20 and the base 10c can be prevented by the wires 12 and 13 that have the wide portions G12 and G13. Also, there is no mounting of a heat generating part on the wires 12 and 13, and heat dissipation can be improved by heat of the molded resin 20 being transferred via the wires 12 and 13.

Also, these kinds of wide portions G12 and G13 can be disposed not only at either end of the semiconductor module 1c, but also in a center.

Although the present application is described in terms of various exemplifying embodiments and implementations, it should be understood that the various features, aspects, and functionality described in one or more of the individual embodiments are not limited in their applicability to the particular embodiment with which they are described, but instead can be applied, alone or in various combinations to one or more of the embodiments.

It is therefore understood that numerous modifications that have not been exemplified can be devised without departing from the scope of the present application. For example, at least one constituent component may be modified, added, or eliminated. At least one of the constituent components in at least one of the preferred embodiments may be selected and combined with the constituent components mentioned in another preferred embodiment.

REFERENCE SIGNS LIST 1, 1a, 1b, 1c semiconductor module, 2 motor, 3 power supply, 4 ground, 10 frame, 10a, 10b, 10c base, 11 recessed portion, 11a recessed portion, 12, 13 wire, 14a to 14d protruding portion, 20 molded resin, 21 mounting portion, 100 frame cutting line, C1, C2, C3, C4, C5, C6 small signal terminal, B1, B2, G1, G2, M1, M2 large current terminal, T1, T2, T3, T4 semiconductor switching element, G10, G11, G12, G13, G20 wide portion, J1, J2 jumper wire

The invention claimed is:

1. A semiconductor module, comprising:
a base configuring a plurality of terminals or wires;
a semiconductor switching element mounted on a mounting portion of the terminal; and
a molded resin that seals the semiconductor switching element, wherein
a wide portion having a width greater than that of the terminal or the wire is a reinforcing member and formed in one portion of the terminal or the wire in an outer peripheral side end portion of the molded resin, and
the wide portion is embedded and fixed in an interior of the molded resin in a state extended toward the interior from the outer peripheral side end portion of the molded resin,
wherein one portion of the wide portion is formed protruding from an external side face of the molded resin.

2. The semiconductor module according to claim 1, wherein the wide portion is formed to be wider than a wiring width compatible with an amount of current flowing through the terminal or the wire.

3. The semiconductor module according to claim 1, wherein a recessed portion or a hole portion is provided in one portion of the wide portion and the molded resin.

4. The semiconductor module according to claim 1, wherein the plurality of terminals comprises a small signal terminal and a large current terminal that conducts a greater current than does the small signal terminal, and the wide portion is provided in a ground wire disposed neighboring the small signal terminal or the large current terminal.

5. The semiconductor module according to claim 1, wherein the wide portion extends along one side of the molded resin, and is disposed in both end portions of the outer peripheral side end portion of the molded resin.

6. The semiconductor module according to claim 2, wherein a recessed portion or a hole portion is provided in one portion of the wide portion and the molded resin.

7. The semiconductor module according to claim 2, wherein the plurality of terminals comprises a small signal terminal and a large current terminal that conducts a greater current than does the small signal terminal, and the wide portion is provided in a ground wire disposed neighboring the small signal terminal or the large current terminal.

8. The semiconductor module according to claim 2, wherein the wide portion extends along one side of the molded resin, and is disposed in both end portions of the outer peripheral side end portion of the molded resin.

9. The semiconductor module according to claim 3, wherein the plurality of terminals comprises a small signal terminal and a large current terminal that conducts a greater current than does the small signal terminal, and the wide portion is provided in a ground wire disposed neighboring the small signal terminal or the large current terminal.

10. The semiconductor module according to claim 3, wherein the wide portion extends along one side of the molded resin, and is disposed in both end portions of the outer peripheral side end portion of the molded resin.

11. The semiconductor module according to claim 4, wherein the wide portion extends along one side of the molded resin, and is disposed in both end portions of the outer peripheral side end portion of the molded resin.

* * * * *